(12) United States Patent
Chen et al.

(10) Patent No.: US 10,473,739 B2
(45) Date of Patent: Nov. 12, 2019

(54) METHOD FOR COOLING MAGNETIC RESONANCE IMAGING APPARATUS AND MAGNETIC RESONANCE IMAGING APPARATUS

(71) Applicant: SIEMENS HEALTHCARE LIMITED, Camberley (GB)

(72) Inventors: Ping Chen, Shenzhen (CN); Hai Ning Yang, Shenzhen (CN)

(73) Assignee: Siemens Healthcare Limited, Camberley (GB)

( * ) Notice: Subject to any disclaimer, the term of this patent is extended or adjusted under 35 U.S.C. 154(b) by 87 days.

(21) Appl. No.: 15/547,562

(22) PCT Filed: Jan. 29, 2016

(86) PCT No.: PCT/IB2016/000069
§ 371 (c)(1),
(2) Date: Jul. 31, 2017

(87) PCT Pub. No.: WO2016/120718
PCT Pub. Date: Aug. 4, 2016

(65) Prior Publication Data
US 2018/0267119 A1  Sep. 20, 2018

(30) Foreign Application Priority Data
Jan. 30, 2015 (CN) .......................... 2015 1 0047748

(51) Int. Cl.
*G01V 3/00* (2006.01)
*G01R 33/38* (2006.01)
(Continued)

(52) U.S. Cl.
CPC ....... *G01R 33/3804* (2013.01); *G01R 33/381* (2013.01); *H01F 6/04* (2013.01); *H01F 27/16* (2013.01); *G01R 33/3815* (2013.01)

(58) Field of Classification Search
CPC .. G01R 33/38; G01R 33/3804; G01R 33/381; G01R 33/3815; G01R 33/34;
(Continued)

(56) References Cited

U.S. PATENT DOCUMENTS 5,586,437 A    12/1996  Blecher et al.
7,996,117 B2 *  8/2011  Tsuda ................. G01R 33/3804
                                                    700/300

(Continued)

FOREIGN PATENT DOCUMENTS

JP       2004047713 A      2/2004
WO    WO-2004/036604 A1    4/2004
WO    WO-2008/138367 A1   11/2008

*Primary Examiner* — Thang X Le
(74) *Attorney, Agent, or Firm* — Schiff Hardin LLP

(57) ABSTRACT

In a method for cooling an MRI apparatus, and an MRI apparatus, the MRI apparatus has a magnet, a primary cooling device and a secondary cooling device, and a magnet controller, the primary cooling device being in contact with the magnet and the secondary cooling device separately. The magnet controller continuously monitors a pressure of the magnet, and turns off the secondary cooling device if the pressure is greater than or equal to a first preset pressure, of less than a second preset pressure and in a rising state. The present invention can save electricity, and since the duration of use of the secondary cooling device is also reduced, the lifespan of the secondary cooling device is prolonged, saving costs.

10 Claims, 2 Drawing Sheets

(51) Int. Cl.
*H01F 6/04* (2006.01)
*G01R 33/381* (2006.01)
*H01F 27/16* (2006.01)
*G01R 33/3815* (2006.01)

(58) Field of Classification Search
CPC .............. G01R 33/34007; G01R 33/36; G01R 33/3635; G01R 33/3642; G01R 33/48; G01R 33/4818; G01R 33/481; G01R 33/4824; G01R 33/446; G01R 33/4835; G01R 33/4828; G01R 33/54; G01R 33/543; G01R 33/561; G01R 33/563; G01R 33/565; G01R 33/5612; G01R 33/583; G01R 33/5659; G01R 33/56518; G01R 33/56536; G01R 33/56572; G01R 33/5611; G01R 33/5614; G01R 33/5616; G01R 33/56509; G01R 33/341; G01R 33/385; G01R 33/56358; H01F 27/16

USPC .................................................. 324/300–322
See application file for complete search history.

(56) References Cited

U.S. PATENT DOCUMENTS

| | | | |
|---|---|---|---|
| 8,643,367 B2* | 2/2014 | Huang | G01R 33/3804 324/318 |
| 9,075,102 B2* | 7/2015 | Ham | G01R 33/28 |
| 2006/0288710 A1* | 12/2006 | Legall | F25B 9/14 62/6 |
| 2007/0245749 A1 | 10/2007 | Atkins et al. | |
| 2009/0158752 A1* | 6/2009 | Clayton | F04B 41/02 62/6 |
| 2014/0232402 A1* | 8/2014 | Tsuda | G01R 33/389 324/309 |

* cited by examiner

METHOD FOR COOLING MAGNETIC RESONANCE IMAGING APPARATUS AND MAGNETIC RESONANCE IMAGING APPARATUS

BACKGROUND OF THE INVENTION

Field of the Invention

The present invention relates to magnetic resonance technology, in particular to a method for cooling a magnetic resonance imaging apparatus, and a magnetic resonance imaging apparatus.

Description of the Prior Art

Magnetic resonance is a physical phenomenon, which is widely applied in fields such as physics, chemistry and biology as an analysis tool. Magnetic resonance imaging (MRI) apparatuses are now widely used in the medical field. An MRI apparatus exploits the MRI phenomenon to obtain electromagnetic signals from the human body, and reconstruct human body information, and is suitable for examining different diseases affecting all systems throughout the human body.

In an MRI apparatus, in order to attain the superconducting properties of the magnet, the magnet which generates the magnetic field must be put into a low-temperature state, therefore a cold head, a compressor and a water cooling device will be used to form a cooling system to conduct heat out. When the MRI apparatus is not scanning, the cooling system remains in an operating state continuously; this will waste a large amount of energy, giving rise to an unnecessary cost burden.

SUMMARY OF THE INVENTION

In view of the above, the present invention proposes a method for cooling an MRI apparatus, and an MRI apparatus, to solve the problem of energy wastage in the prior art.

A first aspect of the present invention provides a method for cooling an MRI apparatus, the MRI apparatus comprising a magnet, a primary cooling device and a secondary cooling device, the primary cooling device being in contact with the magnet and the secondary cooling device separately, and the method for cooling the MRI apparatus being used in a shutdown state or standby state of the MRI apparatus, and comprising:

a monitoring step, continuously monitoring a pressure of the magnet;

a first judgment step, judging the pressure, and if the pressure is greater than or equal to a first preset pressure, less than a second preset pressure and in a rising state, performing a first operation step;

a first operation step, turning off the secondary cooling device.

Another aspect of the present invention provides an MRI apparatus, comprising:

a magnet;

a primary cooling device, in contact with the magnet;

a secondary cooling device, in contact with the primary cooling device;

a pressure sensor, for detecting a pressure of the magnet;

a magnet controller, for continuously monitoring the pressure of the magnet, judging the pressure, and if the pressure is greater than or equal to a first preset pressure, less than a second preset pressure and in a rising state, turning off the secondary cooling device.

It can be seen from the above technical solution that with the method for cooling an MRI apparatus and the MRI apparatus provided by the present invention, if the MRI apparatus is shut down or on standby, it can stop the operation of the secondary cooling device when the magnet pressure is greater than or equal to the first preset pressure, less than the second preset pressure and in a rising state; at this time, the magnet pressure, although rising, will still be capable of normal operation for a certain period of time. Thus, having the secondary cooling device stop for a certain period of time can save electricity, and since the duration of use of the secondary cooling device is also reduced, the lifespan of the secondary cooling device is prolonged, saving costs.

DESCRIPTION OF THE PREFERRED EMBODIMENTS

The present invention is explained in further detail below by way of embodiments, to clarify the object, technical solution and advantages thereof.

Figure 1:
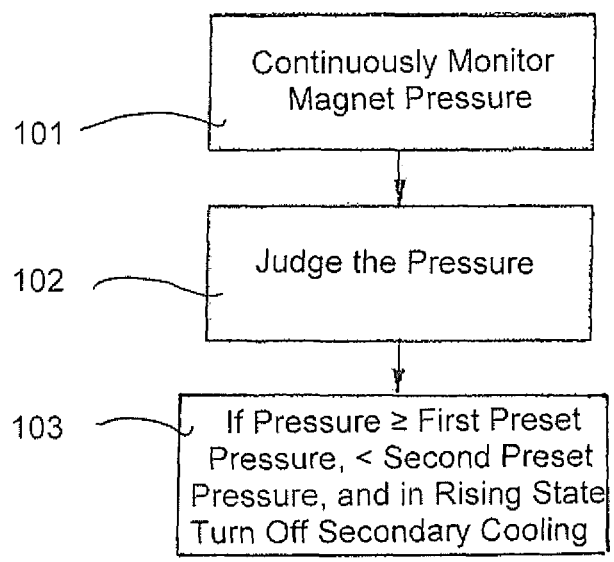
FIG. 1 is a schematic flow chart of the method for cooling an MRI apparatus according to an embodiment of the present invention.

This embodiment provides a method for cooling an MRI apparatus, an executing main body of the method for cooling an MRI apparatus being the MRI apparatus, and the MRI apparatus comprising a magnet, a primary cooling device and a secondary cooling device, the primary cooling device being in contact with the magnet and the secondary cooling device separately, and the method for cooling the MRI apparatus being used in a shutdown or standby state of the MRI apparatus. FIG. 1 shows a schematic flow chart of the method for cooling an MRI apparatus according to this embodiment.

Step 101, continuously monitoring magnet pressure.

This step is a monitoring step. The MRI apparatus comprises a magnet, a cooling system for MRI apparatus cooling comprises a primary cooling device and a secondary cooling device, for example, the primary cooling device for magnet cooling and the secondary cooling device for primary cooling device cooling. The primary cooling device comprises a magnet and a compressor (magnet refrigerator, MREF), wherein a cold head is for magnet cooling, the compressor is for cold head cooling, the cold head is in contact with the magnet and compressor separately, and the compressor is in contact with the secondary cooling device. There are many ways in which the MRI apparatus can monitor magnet pressure, e.g. a pressure sensor is provided on the magnet, the pressure sensor being used to detect pressure, and the magnet pressure detected by the pressure sensor being continuously monitored by a magnet controller.

Shutdown of the MRI apparatus means that power is cut off from the entire MRI apparatus or from main functional components; MRI apparatus standby means that the MRI apparatus is not in an operating state, and can return to an operating state without the need for restarting.

In this embodiment, the specific structures of the cold head and compressor are both prior art, so are not repeated here.

Step 102, judging the pressure.

This step is a first judgment step; if the pressure is greater than or equal to a first preset pressure, less than a second preset pressure and in a rising state in the first judgment step, then a first operation step is performed.

Step 103, if the pressure is greater than or equal to a first preset pressure, less than a second preset pressure and in a rising state, then the secondary cooling device is turned off.

Shutting down the primary cooling device (under the conditions described below) is a first operation step, which can also include shutting down the secondary cooling device under the above-described conditions. In this embodiment, the primary cooling device is in direct contact with the magnet, and used for cooling the magnet; the secondary cooling device is in direct contact with the primary cooling device, and used for performing heat exchange with the primary cooling device, to lower the temperature of the primary cooling device. The secondary cooling device comprises a water cooling device, taking away the heat of the primary cooling device through circulation of water. In this embodiment, the first preset pressure is less than the second preset pressure.

Due to the secondary cooling device, the primary cooling device for magnet cooling will also gradually lose its cooling effect because heat cannot be dissipated promptly, this will lead to a portion of liquid turning into a gas, and then the magnet pressure will gradually rise because the gas cannot be dissipated promptly. The MRI apparatus can draw a pressure curve according to pressure data acquired, and judge whether the magnet pressure is in a rising state according to the pressure curve; it can also judge whether the pressure is in a rising state by comparing a currently acquired pressure with a number of previously acquired pressures. The specific choice of how to judge that the pressure is in a rising state can be made according to actual requirements, and is not restricted here.

If the MRI apparatus finds through monitoring that the magnet pressure is greater than or equal to the first preset pressure, less than the second preset pressure and in a rising state, then operation of the secondary cooling device is stopped, so that the secondary cooling device no longer cools the primary cooling device. It must be pointed out that, to make the primary cooling device safer, the primary cooling device preferably takes precedence at the same time as operation of the secondary cooling device is stopped. That is, the first operation step may also comprise shutting down the primary cooling device.

The first preset pressure and second preset pressure in this embodiment must be set within a range of safe operation of the magnet, and specifically may be set according to actual requirements; this will not be discussed further here. Upon determining that the primary cooling device is shut down or on standby, the MRI apparatus turns off the secondary cooling device, saving electricity, and prolonging the service life of the secondary cooling device.

It must be pointed out that monitoring of magnet pressure by the MRI apparatus and judging whether the MRI apparatus is shut down or on standby are not carried out in a specific order.

According to the method for cooling an MRI apparatus in this embodiment, if the MRI apparatus is shut down or on standby, operation of the secondary cooling device may be stopped when the magnet pressure is greater than or equal to the first preset pressure, less than the second preset pressure and in a rising state; at this time, the magnet pressure, although rising, will still be capable of normal operation for a certain period of time. Thus, having the secondary cooling device stop for a certain period of time can save electricity, and since the duration of use of the secondary cooling device is also reduced, the lifespan of the secondary cooling device is prolonged, saving costs.

Another embodiment of the present invention provides further supplementary illustration of the embodiment above.

The method of this embodiment also comprises:

a second judgment step, if pressure is less than a first preset pressure or greater than or equal to a second preset pressure or in a falling state, performing a second operation step;

a second operation step, turning on the secondary cooling device.

In this embodiment, the magnet pressure is greater than a second preset pressure or less than a first preset pressure and in a falling state. At this time, the secondary cooling device may be turned on to continue to cool the primary cooling device, and thereby cool the magnet.

According to the method for cooling an MRI apparatus in this embodiment, if the MRI apparatus is shut down or on standby, operation of the secondary cooling device may be stopped when the magnet pressure is greater than or equal to the first preset pressure, less than the second preset pressure and in a rising state; at this time, the magnet pressure, although rising, will still be capable of normal operation for a certain period of time; operation of the secondary cooling device is started when the pressure is less than the first preset pressure, greater than or equal to the second preset pressure or in a falling state. Thus, having the secondary cooling device stop for a certain period of time can save electricity, and since the duration of use of the secondary cooling device is also reduced, the lifespan of the secondary cooling device is prolonged, saving costs.

Another embodiment of the present invention provides further supplementary illustration of the embodiment above.

A third judgment step, judging the pressure, and if the pressure is greater than or equal to a third preset pressure, less than a first preset pressure and in a rising state, or the pressure is greater than or equal to a second preset pressure, less than a fourth preset pressure and in a rising state, performing a third operation step;

a third operation step, shutting down the primary cooling device.

In this embodiment, the second preset pressure is less than the fourth preset pressure. When the MRI apparatus is shut down or on standby, if the pressure is greater than or equal to a third preset pressure, less than a first preset pressure and in a rising state, or the pressure is greater than or equal to the second preset pressure, less than the fourth preset pressure and in a rising state, then the primary cooling device in direct contact with the magnet is turned off, so as to further save energy.

Optionally, the method for cooling an MRI apparatus in this embodiment also comprises:

a fourth judgment step, judging the pressure, and if the pressure is less than or equal to a fourth preset pressure, greater than a third preset pressure and in a falling state, performing a fourth operation step;

a fourth operation step, turning on the primary cooling device.

Due to the shutdown of the primary cooling device for magnet cooling, the magnet pressure will correspondingly rise, and when the pressure is less than or equal to a fourth preset pressure, greater than a third preset pressure and in a falling state, the primary cooling device must be turned on, so as to lower the temperature of the magnet. The third preset pressure is less than the first preset pressure.

In this embodiment, when the MRI apparatus is shut down or on standby, further energy is saved by turning off the primary cooling device in direct contact with the magnet, lowering costs.

The embodiments above are explained in detail below by way of examples. Specifically, the first preset pressure is P1, the second preset pressure is P2, the third preset pressure is P3, and the fourth preset pressure is P4. P3<P1<P0<P2<P4.

Figure 2:
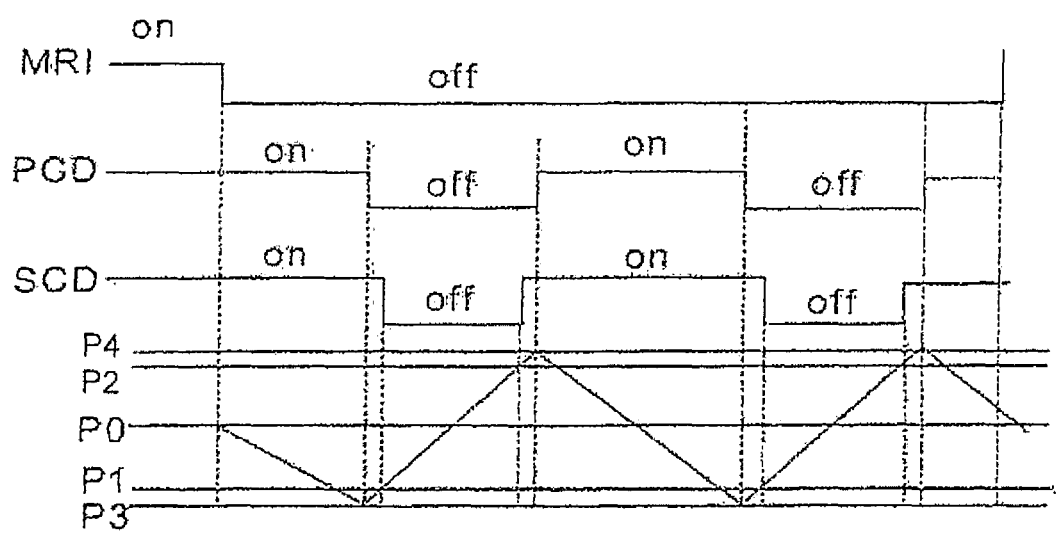
FIG. 2 is a schematic diagram of the relationship between the cooling devices and the magnet pressure according to another embodiment of the present invention.

FIG. 2 shows a schematic diagram of the relationship between the cooling system and the magnet pressure.

Suppose that when the MRI apparatus enters a shutdown or standby state, the magnet pressure is P0; at this time the cooling system for magnet cooling is still operating, and the magnet pressure falls continuously.

First of all, the MRI apparatus continuously monitors the magnet pressure, and upon finding through monitoring that the magnet pressure has fallen to the third preset pressure P3, sends an instruction to the primary cooling device (PCD), to turn off the primary cooling device for magnet cooling, e.g. a cold head and a compressor. Once the primary cooling device is turned off, i.e. once the primary cooling device is then in an OFF state, the magnet pressure then rises.

Next, the MRI apparatus continues to monitor the magnet pressure, and upon finding through monitoring that the pressure is greater than or equal to the first preset pressure P1, sends an instruction to the secondary cooling device (SCD), to stop the operation of the secondary cooling device (SCD), and no longer lower the temperature of the primary cooling device.

Then, the MRI apparatus continues to monitor the magnet pressure, and upon finding through monitoring that the pressure is greater than or equal to a second preset pressure P2, sends a startup instruction to the secondary cooling device, to turn on the secondary cooling device, i.e. the secondary cooling device is then in an ON state, and prepares to lower the temperature of the primary cooling device.

Next, the MRI apparatus continues to monitor the magnet pressure, and upon finding through monitoring that the pressure has risen to the fourth preset pressure P4, sends a startup instruction to the primary cooling device, to turn on the primary cooling device, to lower the temperature of the magnet. Once the primary cooling device is turned on, the magnet pressure falls.

Then, when it is again found through monitoring that the magnet pressure has fallen to the third preset pressure P3, the above steps are repeated, and this cycle is repeated, so that the cooling system is turned off when the MRI apparatus enters a shutdown or standby state, to save energy and lower costs.

In this embodiment, when the MRI apparatus is not operating, having both the primary cooling device and the secondary cooling device turned off can save a large amount of electricity.

Figure 3:
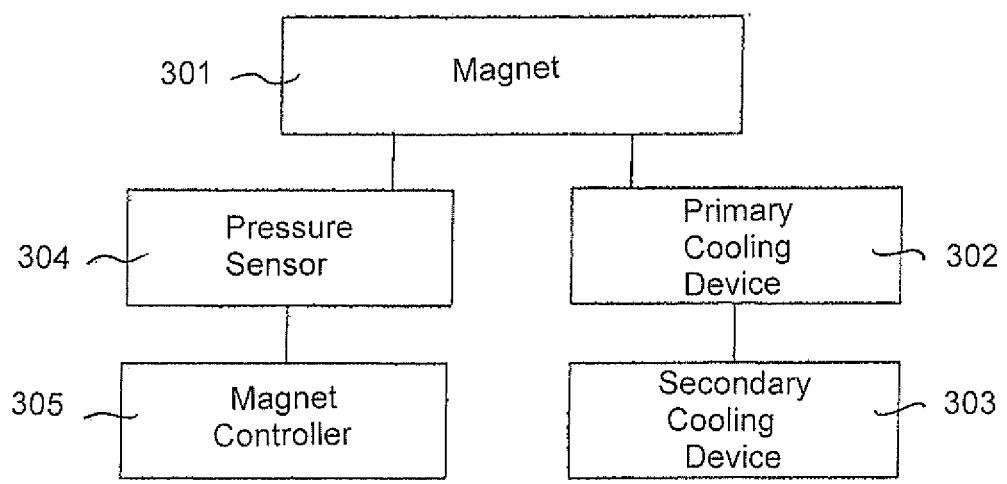
FIG. 3 is a structural schematic diagram of the MRI apparatus according to another embodiment of the present invention.

Another embodiment of the present invention provides an MRI apparatus, for executing the above method for cooling an MRI apparatus. As FIG. 3 shows, the MRI apparatus of this embodiment comprises a magnet 301, a primary cooling device 302, a secondary cooling device 303, a pressure sensor 304 and a magnet controller 305 (i.e., a processor, or computer or control circuit).

The primary cooling device 302 is in contact with the magnet 301; the secondary cooling device 303 is in contact with the primary cooling device 302; the pressure sensor 304 is used to detect the magnet pressure; the magnet controller 305 is used to continuously monitor the magnet pressure, judge the pressure, and if the pressure is greater than or equal to a first preset pressure, less than a second preset pressure and in a rising state, the secondary cooling device is turned off.

The specific operating method of the MRI apparatus of this embodiment is the same as in the above embodiments, so is not repeated here.

Optionally, the magnet controller 305 of this embodiment is also used to turn off the primary cooling device.

The primary cooling device of this embodiment may comprise a cold head and a compressor, the cold head cooling the magnet and the compressor cooling the cold head, the cold head being in contact with the magnet and the compressor separately, and the compressor being in contact with the secondary cooling device. The secondary cooling device of this embodiment comprises a water cooling device.

If the MRI apparatus according to this embodiment is shut down or on standby, it can stop the operation of the secondary cooling device when the magnet pressure is greater than or equal to the first preset pressure, less than the second preset pressure and in a rising state; at this time, the magnet pressure, although rising, will still be capable of normal operation for a certain period of time. Thus, having the secondary cooling device stop for a certain period of time can save electricity, and since the duration of use of the secondary cooling device is also reduced, the lifespan of the secondary cooling device is prolonged, saving costs.

Another embodiment of the present invention provides further supplementary illustration of the MRI apparatus cooling devices in the embodiment above.

In this embodiment, the magnet controller is also used for:
turning on the secondary cooling device if the pressure is less than a first preset pressure, greater than or equal to a second preset pressure or in a falling state.

Optionally, the magnet controller is also used for:
judging the pressure, and if the pressure is greater than or equal to a third preset pressure, less than a first preset pressure and in a rising state, or the pressure is greater than or equal to a second preset pressure, less than a fourth preset pressure and in a rising state, turning off the primary cooling device.

Optionally, the magnet controller is also used for:
judging the pressure, and if the pressure is less than or equal to a fourth preset pressure, greater than a third preset pressure and in a falling state, turning on the primary cooling device.

In this embodiment, when the MRI apparatus is shut down or on standby, further energy is saved by turning off the primary cooling device in direct contact with the magnet, lowering costs.

Those skilled in the art will appreciate that implementation of all or some steps of the above method embodiments may be accomplished by hardware associated with program instructions; this program may be stored in a computer-readable storage medium, and execution of the program includes steps of the above method embodiments. The storage medium includes various media capable of storing program code such as ROM, RAM, magnetic disc or optical disc.

Finally it should be noted that the above embodiments are merely intended to explain the technical solution of the present invention, not to limit it. Although the present invention has been explained in detail with reference to the embodiments above, those skilled in the art should understand that they could still amend the technical solutions recorded in the various embodiments above, or perform an equivalent substitution of some of the technical features therein, without such amendments or substitutions causing the essence of the corresponding technical solutions to fall outside the range of the technical solutions in the various embodiments of the present invention.

The invention claimed is:

1. A method performed by a magnetic resonance imaging (MRI) apparatus for cooling the MR apparatus, wherein the MRI apparatus comprises a magnet, a primary cooling device, a secondary cooling device, and a pressure sensor that detects a pressure of the magnet, the primary cooling device being in contact with the magnet and the secondary cooling device separately, the method comprising:
   continuously monitoring the pressure of the magnet;
   turning off the secondary cooling device if the pressure is greater than or equal to a first preset pressure, less than a second preset pressure, and in a rising state between the first preset pressure and the second preset pressure.

2. The method for cooling the MRI apparatus as claimed in claim 1, wherein
   the secondary cooling device is turned on if the pressure is less than a first preset pressure or greater than or equal to the second preset pressure, or in a falling state between the second preset pressure and the first preset pressure.

3. The method for cooling the MRI apparatus as claimed in claim 2, further comprising:
   turning off the primary cooling device if the pressure is greater than or equal to a third preset pressure, less than the first preset pressure, and in a rising state between the third preset pressure and the first preset pressure, or the pressure is greater than or equal to the second preset pressure, less than a fourth preset pressure, and in a rising state between the second preset pressure and the fourth preset pressure.

4. The method for cooling the MRI apparatus as claimed in claim 3, further comprising:
   turning on the primary cooling device if the pressure is less than or equal to the fourth preset pressure, greater than the third preset pressure, and in a falling state between the fourth preset pressure and the third preset pressure.

5. The method for cooling the MRI apparatus as claimed in claim 1, wherein the primary cooling device is turned off if the pressure is greater than or equal to said first preset pressure, less than said second preset pressure and in said rising state between the first preset pressure and the second preset pressure.

6. A magnetic resonance imaging (MRI) apparatus, comprising:
   a magnet;
   a primary cooling device that is in contact with the magnet;
   a secondary cooling device that is in contact with the primary cooling device;
   a pressure sensor that detects a pressure of the magnet;
   a magnet controller configured to continuously monitor the pressure of the magnet, and to judge the pressure, and if the pressure is greater than or equal to a first preset pressure, less than a second preset pressure, and in a rising state between the first preset pressure and the second preset pressure, then to turn off the secondary cooling device.

7. The MRI apparatus as claimed in claim 6, wherein the magnet controller is also configured to turn on the secondary cooling device if the pressure is less than the first preset pressure, greater than or equal to the second preset pressure, or in a falling state between the second preset pressure and the first preset pressure.

8. The MRI apparatus as claimed in claim 7, wherein the magnet controller is also configured to turn off the primary cooling device if the pressure is greater than or equal to a third preset pressure between the third preset pressure and the first preset pressure, less than the first preset pressure and in a rising state, or the pressure is greater than or equal to the second preset pressure, less than a fourth preset pressure, and in a rising state between the second preset pressure and the fourth preset pressure.

9. The MRI apparatus as claimed in claim 8, wherein the magnet controller is also configured to turn on the primary cooling device if the pressure is less than or equal to the fourth preset pressure, greater than the third preset pressure, and in a falling state between the fourth preset pressure and the third preset pressure.

10. The MRI apparatus as claimed in claim 6, wherein the primary cooling device comprises a cold head and a compressor, the cold head being in contact with the magnet and the compressor separately, the compressor being in contact with the secondary cooling device, and the secondary cooling device comprises a water cooling device.

* * * * *